United States Patent
Koenemann et al.

[19]

[11] Patent Number: 5,612,963
[45] Date of Patent: Mar. 18, 1997

[54] HYBRID PATTERN SELF-TESTING OF INTEGRATED CIRCUITS

[75] Inventors: Bernd K. F. Koenemann, Hopewell Junction; Kenneth D. Wagner, Wappingers Falls, both of N.Y.; John A. Waicukauski, Tulatin, Oreg.

[73] Assignee: International Business Machines Corporation, Armonk, N.Y.

[21] Appl. No.: 486,100

[22] Filed: Jun. 7, 1995

Related U.S. Application Data

[63] Continuation of Ser. No. 749,093, Aug. 23, 1991, abandoned.

[51] Int. Cl.$^6$ .................................................. G01R 31/28
[52] U.S. Cl. ........................................ 371/27; 364/717
[58] Field of Search ...................... 371/27, 22.3, 22.4, 371/25.1; 395/183.01; 364/717

[56] References Cited

U.S. PATENT DOCUMENTS

| | | | |
|---|---|---|---|
| 3,719,885 | 3/1973 | Carpenter et al. | 371/27 |
| 4,687,988 | 8/1987 | Eichelberger et al. | 371/22.3 |
| 4,801,870 | 1/1989 | Eichelberger et al. | 371/22.4 |
| 5,043,988 | 8/1991 | Brglez et al. | 371/27 |
| 5,239,262 | 8/1992 | Grutzner et al. | 324/158 R |
| 5,297,151 | 3/1994 | Gruetzner et al. | 371/27 |
| 5,323,400 | 6/1994 | Agarwal et al. | 371/27 |
| 5,394,405 | 2/1995 | Savir | 371/27 |
| 5,414,716 | 5/1995 | Bershteyn | 371/27 |

*Primary Examiner*—Hoa T. Nguyen
*Attorney, Agent, or Firm*—Lawrence D. Cutter

[57] ABSTRACT

A hybrid random pattern self-test approach is employed in an on-chip fashion to provide desired test signals to circuits on the chip. A simplified weighting circuit is shown to be effective even when only a single bit from a linear feedback shift register is employed for random signal generation. The reduction in linear feedback shift register size and associated weighting circuitry enables the apparatus to be much more readily usable in an on-product configuration thus resulting in significant initial and subsequent test circuit advantages.

13 Claims, 3 Drawing Sheets

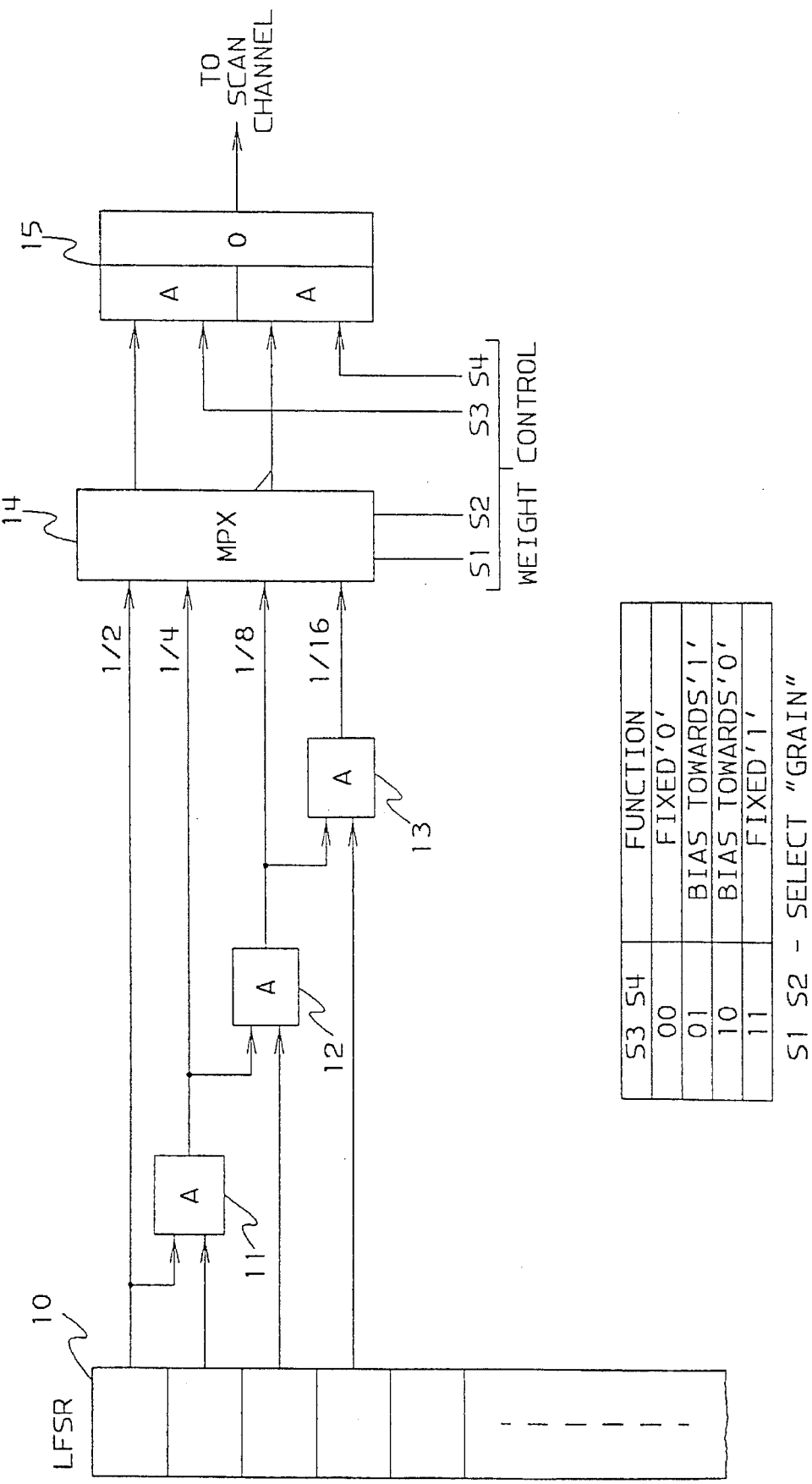

HYBRID PATTERN SELF-TESTING OF INTEGRATED CIRCUITS

This application is a continuation of application Ser. No. 07/749,093 filed Aug. 23, 1991, now abandoned.

BACKGROUND OF THE INVENTION

This invention relates to the testing of integrated circuit chip devices by means of the weighted random pattern method. More particularly, the the present invention provides an on-product, self-test method for high quality testing which is efficient in terms of test coverage and also efficient in terms of the utilization of chip "real estate".

As integrated circuit chip devices have become more compact and have been produced with greater and greater levels of circuit density, the testing of these circuits for logic faults and other defects has become a difficult problem. Because of the complexity of the circuits produced on individual circuit chips, it has become very difficult, if not impossible, to provide a completely specified set of input test signals (generally referred to as test vectors) which fully covers all defects in the circuit. Storing such an extensive set of patterns is very restrictive in terms of the amount of memory that is required, even off-line, for such large amounts of data. Accordingly, designers have turned to pseudo-random pattern testing as one solution to the circuit test problem.

It should also be appreciated that in general, chip test methods are divisible into two classes: on-chip and off-chip. In the off-chip approach, test vectors are generated external to the chip (or product on a system or board level) and are supplied to the chip for test purposes. This approach has the advantage that the storage requirements for test data are less stringent than on-chip solutions. However, the off-chip approach suffers from the disadvantage that extra signal lines must be provided to access internal circuit input lines and circuit states.

Additionally, off-chip solutions also suffer from the disadvantage that such tests are performed on a onetime basis subsequent to chip manufacture and prior to product ship. There is no provision for further testing or diagnosis once the chip is in the field. This has two disadvantages. The first disadvantage is immediate and clear, namely that off-chip test methods are not able to provide diagnostic information with respect to chip failure in the field. Additionally, off-chip methods also are incapable of providing information concerning the nature of failures which do occur in the field. In terms of providing a closed loop method for identifying failures in the field with processes which are employed in the production environment, the off-chip testing solution provides little benefit.

Accordingly, it is seen that it is very desirable to be able to provide on-chip generation of test signals. Moreover, it is desirable that this goal be achieved with a minimum amount of test circuitry disposed on the chip itself. On the other hand, the circuitry is required to produce a large number of distinct test patterns which are effective but yet which are generated by means of circuitry which consumes little chip "real estate". This is desirable because it is more useful to employ the chip area for circuits which actually perform desired functions. Thus on-chip test circuitry should be simple, compact but yet effective.

Since it is possible to generate pseudo-random patterns using linear feedback shift register (LFSR) structures which are relatively compact in terms of circuit area requirements, such methods are employed in on-chip test situations. However, conventional random pattern self-test (RPST) methods do not always achieve consistently high fault coverage because of the presence of circuit faults which are resistant to random pattern testing. In these circumstances, flat random patterns eventually become highly ineffective. That is to say, a point is reached where thousands or even millions of patterns may be required to be generated in order to detect each additional fault. See for example, the article "Pseudo-Random Testing" in the IEEE Transactions on Computers, Vol. C-36, No. 3, March 1987 by K. D. Wagner, E. J. McCluskey and C. Chin. The fact that flat random pattern generators have fixed input "weights" of ½ does not contribute to their effectiveness. In particular, for such test methods, for any circuit input the probability of a logic 1 is equal to the probability of a logic 0 that is, 0.5.

Weighted random pattern test methods are costly to implement in terms of on-chip self-test methods. However, they can achieve high fault coverage. Weighted random pattern test methods and circuits are illustrated in the following documents: "Testability-Driven Random Test Pattern Generation" in the IEEE transactions on Computer-Aided Design, Vol. CAD-6, No. 6, 1987 by R. Lisanke, F. Brglez, A. Degeus and D. Gregory; "On Computing Optimized Input Probabilities for Random Tests" in the 24th IEEE Design Automation Conference, Paper 24.2, 1987 by H. J. Wunderlich; "Self-Test Using Unequiprobable Random Patterns" in the 17th IEEE Fault-Tolerant Computing Symposium, July, 1987 by H.-J. Wunderlich; "Self-Testing of Multichip Logic Modules" in the IEEE International Test Conference, Paper 9.3, 1982 by P. Bardell and W. McAnney; "Fault Simulation for Structured VLSI" in VLSI Systems Design, December, 1985 by J. Waicukauski, E. Eichelberger, et al.

Weighted random pattern test generators, such as those described in the documents cited above, produce one or more weight sets. A weight set specifies the weight to be used at each circuit input. With the input pattern probabilities suitably biased (towards producing more zeroes or more ones) according to the weights in the weight set, some random pattern resistant faults become more likely to be detected than by methods in which all inputs have weights set equal to ½. Several weighted random pattern algorithms exist to generate the desired weight sets. They differ in several aspects: (1) how to construct the next fault subset for weight generation, (2) how they resolve conflicting weighting requirements, (3) the minimum weight set effectiveness before it is discarded and a new weight set generated, and (4) the weight factor which expresses how many distinct weight resolutions are available. However, it becomes prohibitively expensive to implement weighted random pattern test generators and weight storage on-chip circuits as the weight factor, F, increases. The number of bits, B, required to specify each input weighting plus "fixed" weights of 0 and 1 is given by:

$$B = \text{ceiling } (\log_2(2F+1)),$$

where the notation "ceiling" represents the greatest integer which is smaller than the quantity in parenthesis.

SUMMARY OF THE INVENTION

In accordance with a preferred embodiment of the present invention, circuits for self-testing of electronic circuit devices employ a hybrid pattern self-test method which greatly simplifies the weight set which is used in weighted random pattern testing. The use of only three special weights permits both low overhead test pattern generators and compact weight storage, making the invention practical for built-in self-test (BIST) circuits.

More particularly, in accordance with one embodiment, the present invention is a digital test generation circuit which comprises means for generating a pseudo-random signal sequence, weighting means for receiving the pseudo-random sequence and for producing a weighted output sequence. Weight storage means are provided for storing a sequence of two bit weights for transmittal to the weighting means. More particularly, the circuit herein is simple, effective and it requires only one connection to a linear feedback shift register device which generates pseudo-random signals.

Accordingly, it is an object of the present invention to provide on-chip and on-product built-in, self-test capabilities.

It is also an object of the present invention to provide a test mechanism which is present both during normal use and subsequent to chip fail in the field.

It is yet another object of the present invention to reduce the amount of circuitry deployed on a chip or in-product for error pattern generation.

It is a still further object of the present invention to provide adequate test vector generation.

It is also another object of the present invention to decrease the overhead associated with test pattern generators and to reduce the size of weight storage. Lastly, but not limited hereto, it is still another object of the present invention to provide a hybrid pattern self-test system having a weight factor of 1 and employing a system of only 3 weights.

DESCRIPTION OF THE FIGURES

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 2 is a block diagram illustrating a conventional test generator implementation for a weight factor of 4, and particularly illustrating the fact that each biased input requires four stages of a linear feedback shift register plus combinational logic to select the weighted value;

DETAILED DESCRIPTION OF THE INVENTION

Figure 1:
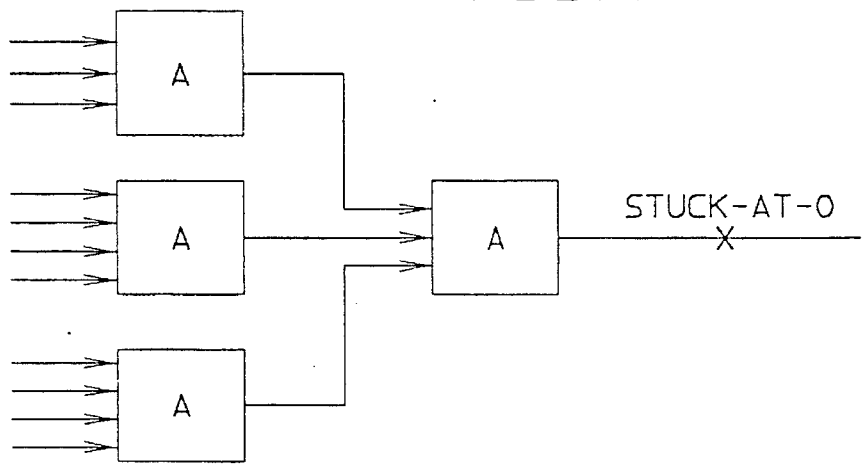
FIG. 1 is a block diagram illustrating why weighted random pattern testing is effective in detecting certain random pattern resistant faults.

In order to fully appreciate the problems that are solved by the present invention, attention is directed to FIG. 1 which illustrates a realistic implementation of a 10 input AND gate. In particular, it is assumed that this implementation is defective in that the rightmost AND gate is in a "stuck at 0" condition. If conventional random pattern testing is employed to detect this fault condition, then only one pattern in $N=2^{10}=1024$ detects this fault. In such circumstances, the "fault detectability", k, is said to be 1, where $k=N(½)^{10}$. Here, the 10 occurs in the exponent because the AND gate embodiment has 10 input signal lines. The base factor (½) is present because all input weights are effectively ½ in the non-weighted random pattern test situation. In contrast, if each input weight is $15/16$, the fault detectability rises to $k=N(15/16)^{10} =537$. In practice, these patterns are derived from pseudo-random pattern generators and the patterns are not repeated throughout the test and accordingly these numbers are realistic. The equations for fault detectability k and test length L if all input signal lines receive signals of weight w are as follows:

$$k=Nw^n \quad (1)$$

$$L=ceiling(N(1-(1-c)^{1/k})) \quad (2)$$

To have a confidence level c equal to 95% of detecting this fault, one requires L=973 flat random patterns. If a weighted random pattern method is employed in the example given above, L=6 such weighted random patterns are required for the 95% confidence level.

In many weighted random pattern test situations, a weight factor F of 4 is typical. In such circumstances, the available weights are of the form $(½)^n$ where $1 \leq n \leq F$, together with the values $1-(½)^n$, where $2 \leq n \leq F$ In the particular case of n=10 and F=4,the set of available weights becomes $\{1/16, 1/8, 1/4, 1/2, 3/4, 7/8, 15/16\}$. Furthermore, to support control signals that must be maintained at fixed values, weights of 0 and 1 are also made available.

FIG. 2 illustrates a test generator implementation for a weight factor of F=4. It is to be particularly noted in FIG. 2 that each biased input which is supplied to a scan channel requires inputs from four stages of linear feedback shift register (LFSR) 10. Additionally, combinational logic is also needed to select the weight value. In particular, it is seen that AND gates 11, 12 and 13, are cascaded as shown to provide various levels of weighting to multiplexer 14. Multiplexer 14 is controlled by signals $S_1$ and $S_2$ which are employed to select the grain. Multiplexer 14 provides true and complemented output signals to selector 15 which is controlled by signals $S_3$ and $S_4$. Selector 15 typically comprises a pair of two input AND gates connected as shown whose outputs are supplied to a single OR gate whose output is directed to the circuits to be tested. If for example, $S_3S_4$ equals 00 then a fixed 0 is supplied as the output from the circuit. If $S_3S_4=11$, then the output is fixed at a logic 1. If $S_3S_4=01$, then the output is biased towards 1. On the other hand, if $S_3S_4=10$, the output is biased towards 0.

However, the most important aspect of FIG. 2 is that there is a requirement for four LFSR stages to be employed and for 4 bits to be read to generate a single test output signal. Additionally, for each test output signal there are also required three AND gates(11, 12, 13), a multiplexer (14) and a selector (15). This illustrates that it is prohibitively expensive to implement weighted random pattern test generators and weight storage on-chip when the weight factor F is large. The number of bits B required to specify each input weighting plus weights of 0 and 1 is given in the following equation:

$$B=ceiling(log(2F+1)) \quad (3)$$

In the present case if F=4, B=4.

Figure 3:
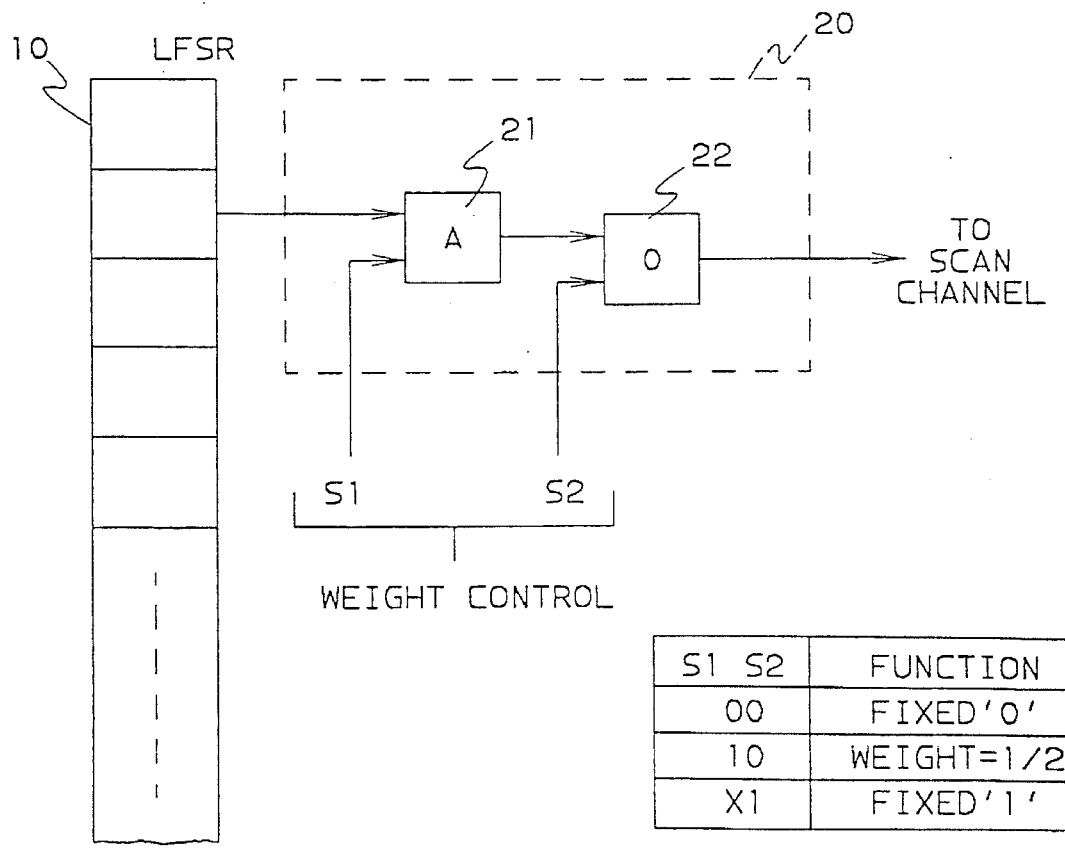
FIG. 3 is a block diagram illustrating a weight control circuit constructed in accordance with the present invention.

This is to be contrasted with the hybrid pattern self-test (HPST) circuit of the present invention as shown in FIG. 3. The circuit of the present invention makes efficient, high quality on-chip self-test available. The HPST circuit of the present invention results in a weight factor of 1, with weights which are 0, ½ and 1. In comparison with usual weighted random pattern on-chip testing, the simple weights allow the HPST to be implemented relatively inexpensively. FIG. 3 illustrates a possible weight generation circuit. In particular, it is noted that weight control circuitry 20 in FIG. 3 requires an input signal from only a single LFSR cell from shift register 10. Furthermore, it is seen that the weight control circuit is implementable utilizing only one AND and one OR logic block, designated by reference numerals 21 and 22 respectively, in FIG. 3. In particular, weight control signal $S_1$ controls the input to AND gate 21 and weight control signal $S_2$ controls the signals supplied to OR gate 22 from AND gate 21. As the table in FIG. 3 shows, if $S_1S_2=00$ then the output is a fixed 0. If $S_1S_2=10$, then a weight of ½ is implemented. If $S_1S_2=01$ or 11, then the output is fixed at a logic 1. It is an unexpected result that such a simple weighting method is still effective in producing a robust set of test signals.

Figure 4:
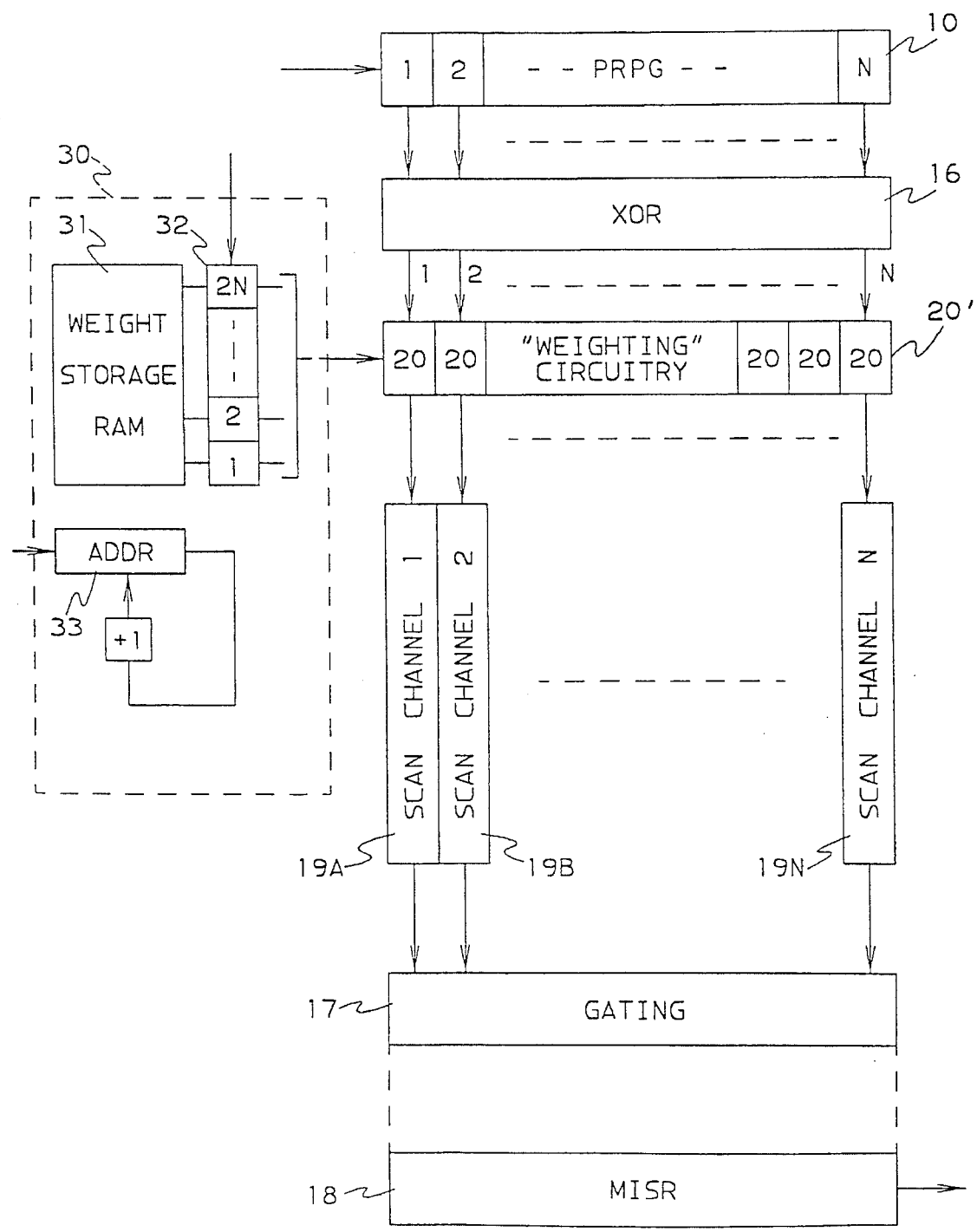
FIG. 4 is a block diagram illustrating the application of the principles of the present invention to a STUMPS (Self Test Using MISR (Multiple Input Shift Register) and Parallel SRSG (Shift Register Sequence Generator)) circuit.

It is noted herein, that the linear feedback shift register shown in FIGS. 2, 3 and 4 are understood to be constructed so as to provide an appropriate set of pseudo-random state patterns as the shift register is cycled from state to state. Such devices are well known for their ability to produce such sequences and are capable of being able to be cycled through a large number of states without repetition.

Weighted random pattern testing has proven very successful in the testing of level sensitive scan design (LSSD) integrated circuit products. For example, see the referenced article by Waicukauski and Motika. Due to the high cost of including circuits for weight storage, pattern generation and response compression on the product, these circuits have instead usually been placed in the tester. Deterministic testing of LSSD logic products uses large pattern memories to store algorithmically generated patterns and has an even longer history of success. However, in either case, moving the test pattern generation onto the product has been too "expensive" in terms of circuit size. STUMPS (see the paper "Self-Testing of Multichip Logic Modules" by P. Bardell and W. McAnney from the IEEE International Test Conference, Paper 9.3, 1982) is a random pattern self-test approach where flat random pattern generators are employed on the product. Unfortunately, random pattern self-test has not generally proven effective in achieving high fault rate coverage in spite of test lengths which far exceed those of deterministic testing.

Since weighted random pattern testing has been very effective, combining its output probability biasing properties while maintaining a circuit overhead comparable with STUMPS design provides a powerful built-in self-test (BIST) method. The test information volume stored by the tester is reduced dramatically relative to deterministic testing. The hybrid pattern self-test described herein moves pattern generation and response compression along with some or all weight storage onto the product or chip, while maintaining high quality testing.

The same test generator and simulator code used for weighted random pattern test generation is also used to develop the hybrid test plan herein. Individual test plans are determined by the weight set data and test links. Test vectors generated for focal fault and surrounding faults are merged. Any conflicting and "don't care" input requirements are assigned a weight value of ½. In hybrid pattern self-testing, all other inputs are assigned fixed value "weights" of 0 or 1 as appropriate. The fault simulator then determines the remaining faults detected (see the article titled "Fault Simulation for Structured VLSI" by Waicukauski and Eichelberger, et al. in VLSI Systems Design, December, 1985). The following table shows a comparison between input weight assignments in weighted random pattern testing and in hybrid pattern self-test:

TABLE I

| Weight Assignment Table | | |
| --- | --- | --- |
| WRP weight | HPST weight | Use |
| 0,1 | 0,1 | Fixed value control signals |
| ½ | ½ | Conflicting or don't care input requirements |
| 15/16 | 1 | Bias towards 1 |
| 1/16 | 0 | Bias towards 0 |

This table does not include the initial weight set used for weighted random pattern testing and hybrid pattern self-test. In this case, weighted random pattern (WRP) testing makes use of the full range of weights available to it generating weights by a structural analysis of the product. However, hybrid pattern self-test uses a flat, random initial weight set.

In hybrid pattern self-test, every weight set requires B=2 bits to specify the weight (0, ½ or 1) for each input. For testing LSSD designs, "inputs" include every shift register latch (SRL) and primary input. Encoding the weights for multiple inputs in a single block would allow the average storage per weight to be further reduced at the expense of more complex decoding circuitry on the product. On-product hybrid pattern self-test circuits include a test pattern generator and a response compressor or signature analyzer. Test pattern generator circuits are preferably implemented with linear feedback shift registers. The signature analyzer is referred to as a multiple input signature register (MISR), (see FIG. 4 discussed below).

Trade offs on chip density, the selection of RAM versus ROM storage, and other considerations determine exactly how many weight sets are stored on any given product. A possible implementation includes the storage of a single unencoded weight set on-product RAM. The tester is still made responsible for writing each weight set in sequence into the array. As well, like most other BIST methods, the tester (an electrical apparatus) also applies the appropriate clock sequences and control signals to initiate and operate the test as well as to scan the linear feedback shift registers.

FIG. 4 illustrates a hybrid pattern self-test implementation in accordance with the present invention with modified STUMPS self-test circuitry. The modifications include weight storage RAM 31 and its associated buffer 32, address generating circuitry 33 as well as linear feedback shift register, test pattern generator 18 with associated weighting circuitry 20'. Weighting circuitry 20' comprises a bank of weighting circuits 20 as shown in FIG. 3. In FIG. 4, RAM 31, buffer 32 and address generator 33 collectively operate as a weight storage means which stores a sequence of two bit weights for transmittal to weighting circuitry 20' comprising individual circuits for producing weighted output sequence in which the distribution of binary digits is altered in accordance with the weighting signals supplied from storage means 30. It is also assumed in FIG. 4 that the product uses a boundary scan approach so that primary input control and observability is available in scan channels 1 through N(reference numerals 19a through 19b respectively). See the text "Logic Design Principles by E. J. McCluskey, Prentice Hall, 1986, Section 10.4—4 for a discussion of boundary scan principles. Weights that are either all ½ or only 0 and 1 are easily obtained and transformed by the generator to supply flat random patterns or to supply deterministic patterns respectively. These capabilities are a useful complement to HPST methods. To perform meaningful diagnostics, product shift register latches (SRLs) should be observable including those of the MISR 18. With a modified STUMPS method, the ability to have MISR 18 select only a single scan channel at any time using Gating 17 while operating as a shift register is very helpful. Block 16 is also present to further permute PRPG data form block 10 to reduce correlation effects.

The HPST method of the present invention is also applicable to testing at a higher logical level, namely at the system level. In fact, the use of HPST methods at a higher level of packaging in the system environment is very desirable. The weight storage RAM is available for functional use if the system has a weight reload capability and the degraded mode of RPST is also always available.

It is useful to compare the characteristics of RPST STUMPS, HPST modified STUMPS and an on-chip WRPST modified STUMPS method to appreciate the benefits of HPST. This comparison is provided in the table below:

TABLE II

|  | STUMPS | HPST | WRPST |
| --- | --- | --- | --- |
| Weight storage circuitry req'd. | N | Y | Y |
| Number of bits per weighted PI | 0 | 2 | 4 |
| Number of LFSR stages (N scan channels) | N | N | 4*N |
| DC Coverage Range (100,000 patterns) | 60–100% | 99–100% | 99–100% |
| Number of Weight Sets | 1 | 1–200 | 1–200 |

It is seen that HPST offers the same high fault coverage potential as WRPST with a significantly smaller implementation cost. For the proposed implementation, HPST requires approximately ½ of the weight storage and buffering, ¼ of the number of shift register stages and ⅕ of the weighting circuitry in comparison with a comparable WRPST implementation.

Experiments demonstrate that HPST is a viable on-product BIST approach. The HPST weight generation algorithm allows more conflicting input requirements than weighted random pattern testing to reduce the impact of using fixed value "weights". Of course, HPST and WRPST test lengths exceed those of deterministic tests with the same fault coverage. However, HPST pattern counts remain significantly below those of RPST for equivalent coverage.

Experiments were performed with 11 bipolar chips each containing 5200 gates and 1 CMOS chip containing 26,000 gates. Three of the 12 chips were significantly random pattern resistant. The most random pattern testable of the three yielded an 84.4% fault coverage (of fault equivalence classes) after 100,096 flat random patterns. The data in Table III below for these 12 chips indicates the average number of patterns (NPAT), the number of weight sets (NWT) and the CPU time (in model 3081 Processor CPU seconds) for 100% fault coverage of non-redundant faults on all chips. The average compares HPST methods with weighted random pattern testing. Note that the number of patterns is reduced by using more weight sets.

TABLE III

| Average Test Parameters (100% Fault Coverage) | | | |
| --- | --- | --- | --- |
|  | NPAT | NWT | CPU |
| HPST | 29082 | 21.4 | 125.8 |
| WRP | 23962 | 20.2 | 84.8 |

From the above, it should be appreciated that the circuit and method of the present invention provides significant advantages in the testing of integrated circuit devices. Additionally, it is seen that the present invention provides a method for moving test circuitry onto the chip itself. This provides a number of advantages which have been discussed above and in particular, it is to be noted that the use of on-chip RAM circuitry for the storage of weights provides significant flexibility and advantages in production environments. It is also seen that applicants have provided a circuit and test method which consumes much less chip area without a loss in functionality. It is also seen that the present invention achieves the objectives stated above. While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A digital test signal generation circuit comprising:

means for generating a pseudo-random sequence of binary digits;

weight storage means for storing a sequence of pairs of weight bits, each pair including a first weight bit and a second weight bit;

conjunctive circuit means for receiving, as a first input, a single bit from said generating means and, as a second input, said first weight bit from said weight storage means and for operating on said first and second inputs in non-inverted form to produce output signals; and disjunctive circuit means for receiving, as a first input, said output signals from said conjunctive circuit means and, as a second input, said second weight bit from said weight storage means, the output signal from said disjunctive circuit means being said test signal.

2. The circuit of claim 1 in which said generating means comprises a linear feedback shift register.

3. The circuit of claim 1 in which said weight storage means comprises a random access memory.

4. The circuit of claim 1 in which said weight storage means comprises a read only memory.

5. The circuit of claim 1 disposed on a circuit chip device the circuits of which receive said weighted output sequence for testing.

6. The circuit of claim 1 in which said conjunctive circuit means is an AND-gate.

7. The circuit of claim 1 in which said disjunctive circuit means is an OR-gate.

8. A digital test signal generation circuit comprising:

means for generating a pseudo-random sequence of binary digits;

weighting means including a first means for receiving a single bit in non-inverted form from said pseudo-random sequence of binary digits and for receiving a first weighting signal supplied to said first means, said weighting means also including a second means for receiving the output of said first means and a second weighting signal for producing a weighted output sequence in which output binary digit distribution is altered; and weight storage means for storing a sequence of weighting signals for transmittal to said weighting means.

9. The circuit of claim 8 in which said generating means comprises a linear feedback shift register.

10. The circuit of claim 8 in which said weight storage means comprises a random access memory.

11. The circuit of claim 8 in which said weight storage means comprises a read only memory.

12. The circuit of claim 8 in which said weighting means comprises:

an AND gate, as said first means, receiving a single bit from said generating means; and an OR gate, as said second means, which receives the output signal from said AND gate, said AND gate and said OR gate also each receiving a single bit input from said weight storage means.

13. The circuit of claim 8 disposed on a circuit chip device having circuits thereon which circuits receive said weighted output sequence for testing.

* * * * *